US011538683B2

(12) United States Patent
Haberecht et al.

(10) Patent No.: US 11,538,683 B2
(45) Date of Patent: Dec. 27, 2022

(54) METHOD FOR DEPOSITING AN EPITAXIAL LAYER ON A FRONT SIDE OF A SEMICONDUCTOR WAFER AND DEVICE FOR CARRYING OUT THE METHOD

(71) Applicant: Siltronic AG, Munich (DE)

(72) Inventors: Joerg Haberecht, Freiberg (DE); Rene Stein, Bobritzsch-Hilbersdorf (DE); Stephan Heinrich, Freiberg (DE)

(73) Assignee: SILTRONIC AG, Munich (DE)

( * ) Notice: Subject to any disclaimer, the term of this patent is extended or adjusted under 35 U.S.C. 154(b) by 225 days.

(21) Appl. No.: 16/765,479

(22) PCT Filed: Nov. 28, 2018

(86) PCT No.: PCT/EP2018/082820
§ 371 (c)(1),
(2) Date: May 20, 2020

(87) PCT Pub. No.: WO2019/110386
PCT Pub. Date: Jun. 13, 2019

(65) Prior Publication Data
US 2020/0294794 A1  Sep. 17, 2020

(30) Foreign Application Priority Data
Dec. 8, 2017  (DE) ..................... 10 2017 222 279.4

(51) Int. Cl.
*H01L 21/02* (2006.01)
*H01L 21/205* (2006.01)
*H01L 21/67* (2006.01)

(52) U.S. Cl.
CPC .... *H01L 21/0262* (2013.01); *H01L 21/02381* (2013.01); *H01L 21/2053* (2013.01); *H01L 21/67115* (2013.01)

(58) Field of Classification Search
CPC .......... H01L 21/0262; H01L 21/02381; H01L 21/2053; H01L 21/67115; H01L 21/02531;
(Continued)

(56) References Cited

U.S. PATENT DOCUMENTS

2007/0227441 A1  10/2007  Narahara et al.
2008/0118712 A1   5/2008  Schauer et al.
(Continued)

FOREIGN PATENT DOCUMENTS

DE  112013005951 T5  9/2015
DE  102016210203 B3  8/2017
(Continued)

*Primary Examiner* — Dale E Page
*Assistant Examiner* — Quovaunda Jefferson
(74) *Attorney, Agent, or Firm* — Leydig, Voit & Mayer, Ltd.

(57) ABSTRACT

A method deposits an epitaxial layer on a front side of a semiconductor wafer having monocrystalline material. The method includes: providing the semiconductor wafer; arranging the semiconductor wafer on a susceptor; heating the semiconductor wafer to a deposition temperature using thermal radiation directed to the front side and to the rear side of the semiconductor wafer; conducting a deposition gas over the front side of the semiconductor wafer; and selectively reducing an intensity of a portion of the thermal radiation that is directed to the rear side of the semiconductor wafer, as a result of which first partial regions at an edge of the semiconductor wafer, in the first partial regions a growth rate of the epitaxial layer is greater than in adjacent second partial regions given uniform temperature of the semiconductor wafer owing to an orientation of the monocrystalline material, are heated more weakly.

5 Claims, 7 Drawing Sheets

(58) Field of Classification Search
CPC ......... H01L 21/68735; H01L 21/68785; C23C 16/4585; C23C 16/46; C23C 16/4586; C30B 25/105; C30B 25/12; C30B 25/20; C30B 29/06
See application file for complete search history.

(56) References Cited

U.S. PATENT DOCUMENTS

| | | | |
|---|---|---|---|
| 2014/0251208 A1* | 9/2014 | Samir | H01L 21/68792 118/500 |
| 2015/0184314 A1* | 7/2015 | Narahara | C30B 25/186 428/157 |
| 2015/0275395 A1 | 10/2015 | Kang | |
| 2019/0106809 A1 | 4/2019 | Haberecht | |

FOREIGN PATENT DOCUMENTS

| | | | |
|---|---|---|---|
| JP | 2001010894 A | 1/2001 | |
| JP | 2015082634 A | 4/2015 | |
| WO | WO 2011075563 A2 | 6/2011 | |
| WO | WO 2013155073 A1 | 10/2013 | |

* cited by examiner

METHOD FOR DEPOSITING AN EPITAXIAL LAYER ON A FRONT SIDE OF A SEMICONDUCTOR WAFER AND DEVICE FOR CARRYING OUT THE METHOD

CROSS-REFERENCE TO PRIOR APPLICATIONS

This application is a U.S. National Phase Application under 35 U.S.C. § 371 of International Application No. PCT/EP2018/082820, filed on Nov. 28, 2018, and claims benefit to German Patent Application No. DE 10 2017 222 279.4, filed on Dec. 8, 2017. The International Application was published in German on Jun. 13, 2019 as WO 2019/110386 A1 under PCT Article 21(2).

FIELD

The invention relates to a method for depositing an epitaxial layer on the front side of a semiconductor wafer. The invention furthermore relates to an apparatus for depositing an epitaxial layer on a front side of a semiconductor wafer composed of monocrystalline material.

BACKGROUND

The deposition of an epitaxial layer on the front side of a semiconductor wafer is usually carried out by means of CVD (chemical vapor deposition) in a CVD reactor, often in a single-wafer reactor. By way of example, US 2014/0 251 208 A1 shall be mentioned, in which such a CVD reactor is described. A single-wafer reactor provides a reaction chamber between an upper and a lower cover (dome), in which reaction chamber a susceptor is held by susceptor carrying arms of a susceptor carrying shaft on susceptor supporting pins. The susceptor and a semiconductor wafer placed thereon are heated by means of thermal radiation by lamp arrays arranged above and below the covers, while a deposition gas is conducted over the front side of the semiconductor wafer facing the upper cover.

US 2008/0118712 A1 describes a susceptor, including a susceptor ring and a susceptor base. The susceptor ring has a ledge for placing a semiconductor wafer in the edge region of the rear side of the semiconductor wafer. In order to deposit a layer on the front side of the semiconductor wafer, the susceptor ring is placed on the susceptor base.

US 2007/0227441 A1 draws attention to periodic fluctuations of the thickness in the edge region of epitaxially coated semiconductor wafers composed of silicon. The reason is different growth rates at which the epitaxial layer grows. The different growth rates are related to the crystal orientation of the front side of the semiconductor wafer. The front side of the semiconductor wafer is that side surface of the semiconductor wafer on which the epitaxial layer is deposited. In order to make the thickness of the epitaxial layer uniform in the edge region, US 2007/0227441 A1 proposes altering the structure of the susceptor with the period of the thickness fluctuations.

With the same objective, US 2015/0184314 A1 proposes limiting the width of the edge region of the semiconductor wafer.

SUMMARY

An embodiment of the present invention provides a method that deposits an epitaxial layer on a front side of a semiconductor wafer having monocrystalline material. The method includes: providing the semiconductor wafer; arranging the semiconductor wafer on a susceptor; heating the semiconductor wafer to a deposition temperature using thermal radiation directed to the front side and to the rear side of the semiconductor wafer; conducting a deposition gas over the front side of the semiconductor wafer; and selectively reducing an intensity of a portion of the thermal radiation that is directed to the rear side of the semiconductor wafer, as a result of which first partial regions at an edge of the semiconductor wafer, in the first partial regions a growth rate of the epitaxial layer is greater than in adjacent second partial regions given uniform temperature of the semiconductor wafer owing to an orientation of the monocrystalline material, are heated more weakly.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
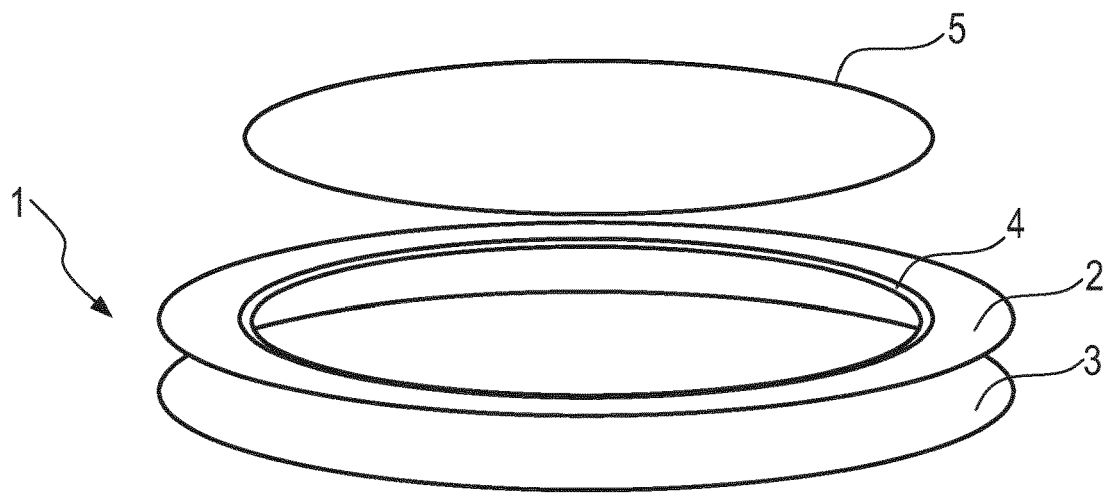
FIG. 1 is an illustration which represents the prior art and which shows the relative arrangement of a susceptor base, a susceptor ring and a semiconductor wafer.

The proposals mentioned in the background require a modification of the susceptor used or of the shape of the edge region of the semiconductor wafer.

Embodiments of the present invention improve the flatness of semiconductor wafers with a deposited epitaxial layer in the edge region, without having to alter the susceptor or the shape of the edge region of the semiconductor wafer for this purpose.

Embodiments of the present invention achieve such improvements using a method for depositing an epitaxial layer on a front side of a semiconductor wafer composed of monocrystalline material, the method including:

providing the semiconductor wafer;

arranging the semiconductor wafer on a susceptor;

heating the semiconductor wafer to a deposition temperature by means of thermal radiation directed to a front side and to a rear side of the semiconductor wafer;

conducting a deposition gas over the front side of the semiconductor wafer; and selectively reducing the intensity of a portion of the thermal radiation that is directed to the rear side of the semiconductor wafer, as a result of which first partial regions at the edge of the semiconductor wafer, in which first partial regions a growth rate of the epitaxial layer is greater than in adjacent second partial regions given uniform temperature of the semiconductor wafer owing to the orientation of the monocrystalline material, are heated more weakly.

Embodiments of the present invention further provide an apparatus for depositing an epitaxial layer on a front side of a semiconductor wafer composed of monocrystalline material, the apparatus including:

a susceptor;

a device for holding and rotating the susceptor having a susceptor carrying shaft and susceptor carrying arms; and a ring that is held by the susceptor carrying arms and has inwardly facing projections that selectively reduce the intensity of thermal radiation passing through them, as a result of which first partial regions at the edge of a semiconductor wafer placed on the susceptor, in which first partial regions a growth rate of the epitaxial layer is greater than in adjacent second partial regions given uniform temperature of the semiconductor wafer owing to the orientation of the monocrystalline material, are heated more weakly.

The semiconductor wafer, or at least a part thereof including the surface of the semiconductor wafer, is monocrystalline and preferably consists of silicon, germanium or a mixture of these elements. The semiconductor wafer can completely consist of one of the materials mentioned. However, it can also be an SOI wafer (silicon on insulator), a bonded semiconductor wafer, or a substrate wafer that has already been coated with one or more epitaxial layers. The epitaxial layer preferably consists of silicon, germanium or a mixture of these elements, and contains electrically active dopant, if appropriate.

The semiconductor wafer can be sliced from a single crystal that has been crystallized according to the FZ method (float zone) or according to the CZ method. The CZ method includes dipping a seed crystal in a melt contained in a crucible, and lifting the seed crystal and the single crystal crystallizing thereon from the melt.

The semiconductor wafer has a diameter of at least 200 mm, preferably at least 300 mm. The front side of the semiconductor wafer is preferably <100>-oriented or <110>-oriented.

In the case of the <100>-orientation of the front side, the edge region of the front side of the semiconductor wafer can be subdivided into in each case four, mutually alternating first and second partial regions. In the four first partial regions, the growth rate of an epitaxial layer is greater than in the four second partial regions of the edge region. The centers of the first partial regions each have an angular position θ with respect to the circumference of the semiconductor wafer. If an orientation notch identifies a <110>-direction perpendicular to the <100>-orientation of the front side of the semiconductor wafer and if the angular position θ of 270° is assigned to this direction, the centers of the four first partial regions have an angular position θ of 0°, 90°, 180° and 270°, respectively, corresponding to the angular positions of the <110>-directions perpendicular to the <100>-orientation of the front side of the semiconductor wafer.

In the case of the <110>-orientation of the front side, the edge region of the front side of the semiconductor wafer can be subdivided into in each case two, mutually alternating partial regions. In the two first partial regions, the growth rate of an epitaxial layer on the front side of the semiconductor wafer is greater than in the two second partial regions of the edge region. If the orientation notch identifies a <110>-direction perpendicular to the <110>-orientation of the front side of the semiconductor wafer and if the angular position θ of 270° is assigned to this direction, the centers of the two first partial regions have an angular position θ of 90° and 270°, respectively, corresponding to the angular positions of the <110>-directions perpendicular to the <110>-orientation of the front side of the semiconductor wafer.

During the deposition of an epitaxial layer on the front side of the semiconductor wafer, the semiconductor wafer lies on the ledge of a susceptor. The susceptor can be embodied integrally or preferably consists of a susceptor ring and a susceptor base. The semiconductor wafer is placed on the susceptor in an oriented manner, that is to say that its orientation notch has a defined position on the ledge of the susceptor. The semiconductor wafer lies on the susceptor in such a way that the first partial regions at the edge of the semiconductor wafer are heated less intensively than the second partial regions. The growth rate of the epitaxial layer is all the greater, the higher the temperature, and thus lower in the first partial regions than in the second partial regions. However, it is dependent not only on the temperature but also on the orientation of the crystal lattice. Moreover, because in the first partial regions the growth rate of the epitaxial layer is greater than in the second partial regions owing to the orientation of the crystal lattice, a matching of the growth rate of the epitaxial layer in the first and second partial regions is achieved overall. In other words, the thickness of the epitaxial layer deposited on the front side of the semiconductor wafer becomes more uniform in the edge region of the semiconductor wafer, which becomes apparent in characteristic figures such as the ESFQR, which describes the flatness of a coated or uncoated semiconductor wafer in the edge region.

According to exemplary embodiments of the invention, the first partial regions are heated less intensively because the intensity of a portion of thermal radiation that is directed to the rear side of the semiconductor wafer is selectively reduced, specifically a portion of the thermal radiation that crucially contributes to the heating of the first partial regions of the semiconductor wafer. For this purpose, inwardly facing projections of a ring are situated in the beam path of the thermal radiation. The projections completely or partially consist of a material having a low transmittance in the IR range of the spectrum, preferably of opaque quartz glass. The transmittance, relative to a material thickness of 10 mm, in the range is preferably not more than 20%, particularly preferably not more than 5%. The thickness of the projections is preferably not less than 5 mm and not more than 10 mm. The projections each have a width in a circumferential direction of not less than 15° and not more than 25°, preferably 20°. They extend radially inward, from the inner circumference of the ring over a length of preferably not less than 20 mm and not more than 30 mm. Part of the above-mentioned portion of the thermal radiation is prevented from passing through the projections. This shading effect is sufficient in order that the semiconductor wafer is heated less intensively in the first partial regions in a desired manner. Suitable material composed of opaque quartz glass is offered for example under the trade name OM® 100 from Heraeus.

The ring having the inwardly facing projections is preferably configured in such a way that it can be inserted into a commercially conventional CVD reactor for coating individual semiconductor wafers, without the reactor having to be structurally modified beforehand. In an apparatus according to an exemplary embodiment of the invention, the ring is held by the susceptor carrying arms of the CVD reactor and for this purpose has holes through which susceptor supporting pins can be inserted. A difference between an apparatus according to an exemplary embodiment of the invention and a CVD reactor of known embodiment thus includes the fact that the described ring is additionally arranged below the susceptor, specifically such that the projections of the ring and the first partial regions at the edge of a semiconductor wafer placed on the susceptor assume a relative position with respect to one another that enables the shading effect described to occur. After the insertion of the susceptor supporting pins, the position of the projections is fixed, as is the position that must be assumed by the first crystal regions, because this then results in accordance with the rules of geometric optics. In this sense the semiconductor wafer is placed on the susceptor in a defined manner.

Exemplary embodiments of the invention are explained in greater detail below with reference to drawings.

The arrangement in accordance with FIG. 1 includes a susceptor base 3 and a susceptor ring 2 having a ledge 4. A semiconductor wafer 5 can be placed on the ledge 4 in the edge region of the rear side of the semiconductor wafer. The susceptor base 3 and the susceptor ring 2 form a bipartite susceptor 1. That is unimportant with regard to the present invention. It goes without saying that an integral susceptor can also be used according to the invention.

The susceptor base 3 preferably consists of graphite felt or of graphite felt coated with silicon carbide, or of graphite coated with silicon carbide, or of silicon carbide; the susceptor ring 2 preferably consists of silicon carbide or of some other material coated with silicon carbide. The other material is preferably graphite or silicon. The susceptor ring 2 has an internal diameter and an external diameter. The internal diameter is smaller and the external diameter is larger than the diameter of the semiconductor wafer 5. The ledge 4 of the susceptor ring 2 extends from the inner edge of the susceptor ring 2 as far as a step that increases the height of the susceptor ring 2. The ledge 4 is preferably shaped in a manner descending inward from the step.

Figure 2:
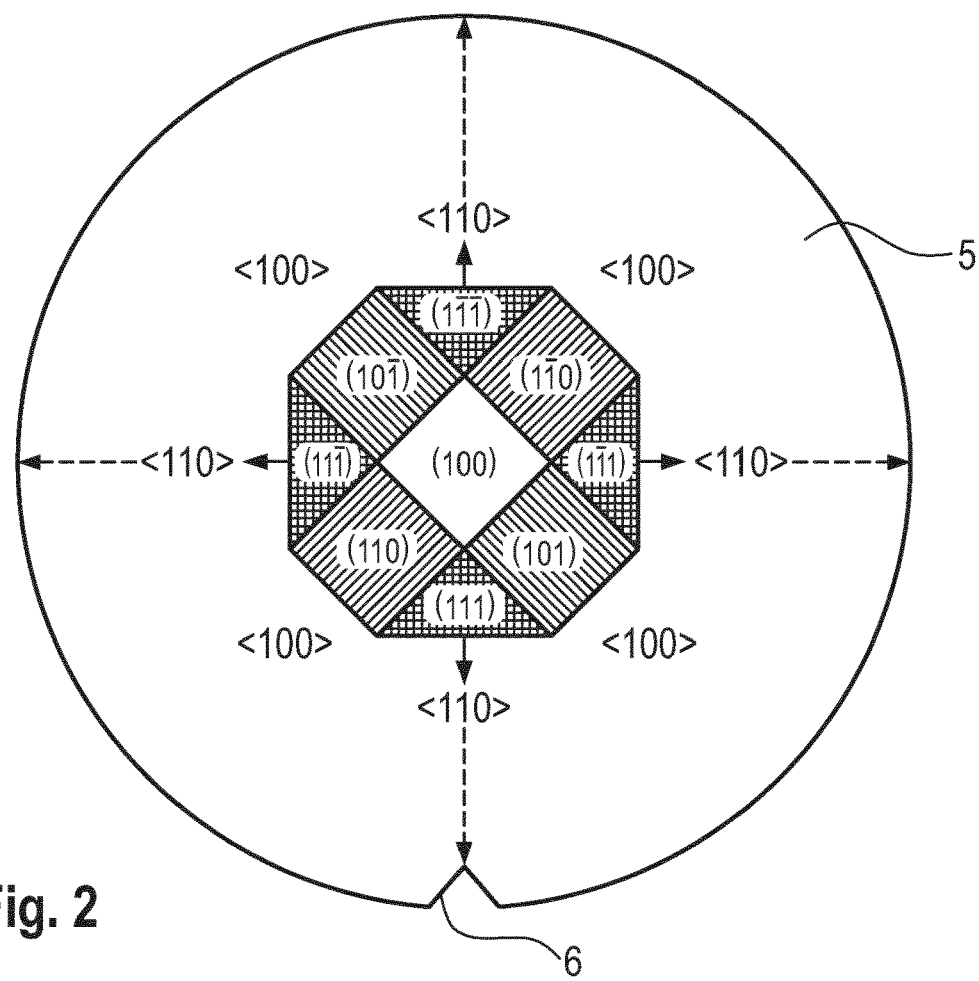
FIG. 2 shows in plan view a semiconductor wafer with <100>-orientation.

FIG. 2 shows a semiconductor wafer 5 having an orientation notch 6. The semiconductor wafer 5 has a <100>-orientation. The orientation notch 6 marks one of four <110>-crystal directions which, distributed around the circumference of the semiconductor wafer at a distance of 90°, indicate planes in the region of the edge of the semiconductor wafer on which an epitaxial layer grows at a comparatively high rate. The dashed arrows thus point to the centers of the first partial regions, in which the growth rate of the epitaxial layer is greater than in adjacent second partial regions given uniform temperature of the semiconductor wafer owing to the orientation of the monocrystalline material. With an angular position of the orientation notch at 270°, the centers of the first partial regions have the angular positions 0°, 90°, 180° and 270°.

Figure 3:
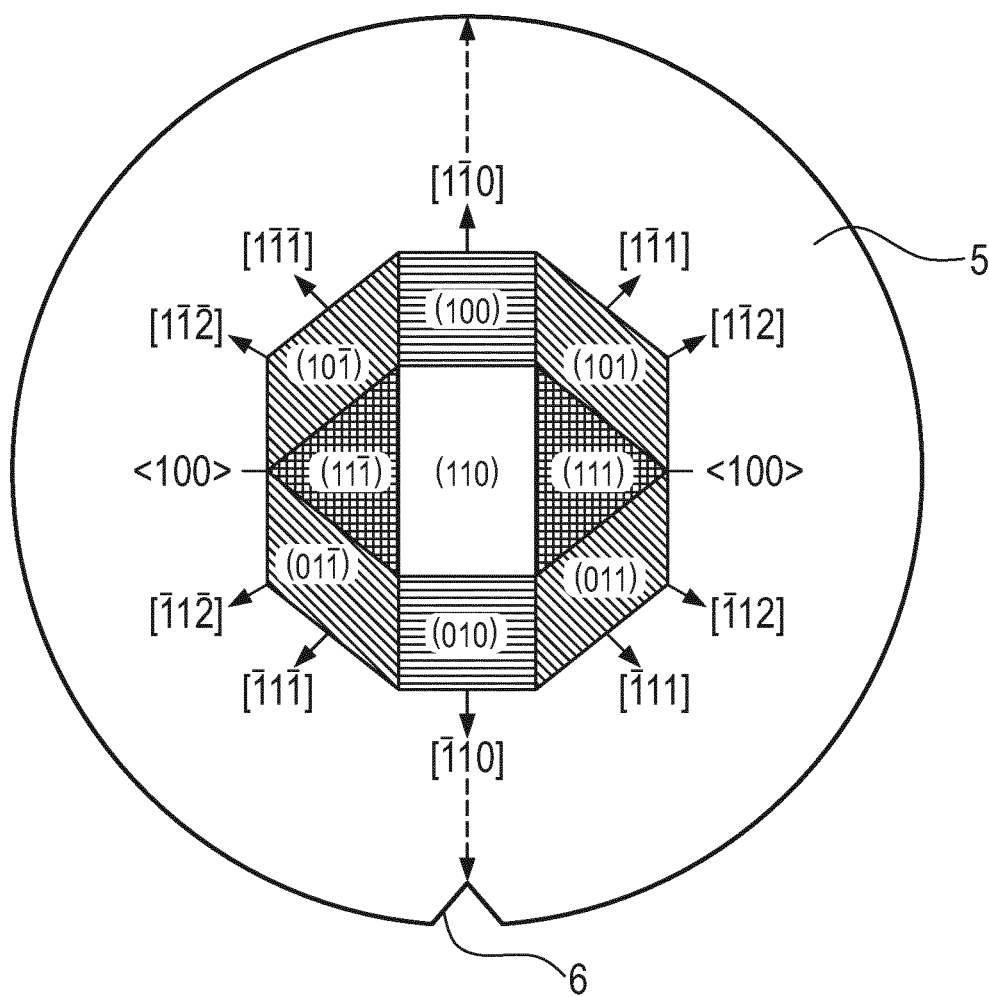
FIG. 3 a semiconductor wafer with <110>-orientation.

FIG. 3 shows orientation features of a semiconductor wafer 5 having <110>-orientation. The orientation notch 6 marks one of two <110>-crystal directions which, distributed around the circumference of the semiconductor wafer at a distance of 180°, indicate planes in the region of the edge of the semiconductor wafer on which an epitaxial layer grows at a comparatively high rate. The dashed arrows thus point to the centers of the first partial regions, in which the growth rate of the epitaxial layer is greater than in adjacent second partial regions given uniform temperature of the semiconductor wafer owing to the orientation of the monocrystalline material. With an angular position of the orientation notch at 270°, the centers of the first partial regions have the angular positions 90° and 270°.

Figure 4:
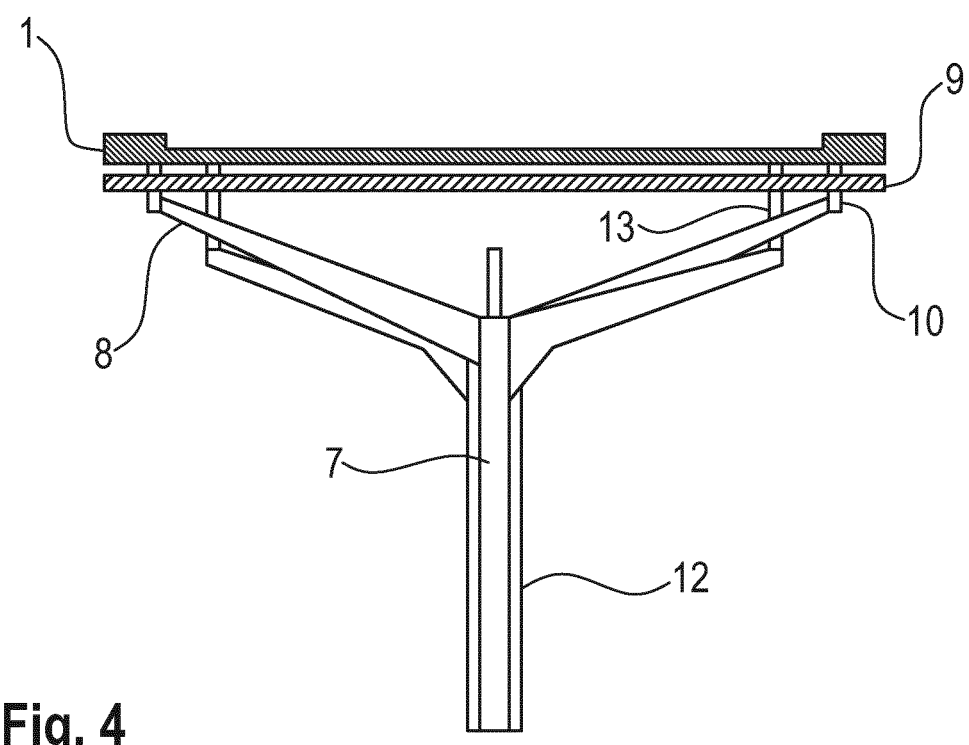
FIG. 4 shows an apparatus in sectional illustration.

An apparatus according to the invention (FIG. 4) includes, besides a susceptor 1, a device for holding and rotating the susceptor 1 having a susceptor carrying shaft 7 and susceptor carrying arms 8. Furthermore, the device for holding and rotating the susceptor 1 can include a wafer lifting shaft 12 and also wafer lifting pins 13. A feature of the apparatus is a ring 9 that is held by the susceptor carrying arms 8 and is arranged below the susceptor 1, without having direct contact with the susceptor 1. The ring 9 is held by the susceptor carrying arms 8 in such a way that it cannot be displaced along its circumferential direction. Preferably, susceptor supporting pins 10 are situated on the susceptor carrying arms 8, the pins being inserted through holes 11 of the ring 9. The distance between an upper surface of the ring 9 and a lower surface of the susceptor 1 is preferably not less than 5 mm and not more than 10 mm. Preferably, an inner edge 17 of the projection 14 of the ring 9 (FIG. 5, FIG. 6 and FIG. 7) is situated at a radial position which is at a distance from a center Z of the ring 9 of not less than 140 mm, preferably not less than 145 mm, particularly preferably 148 mm to 150 mm.

Figure 5:
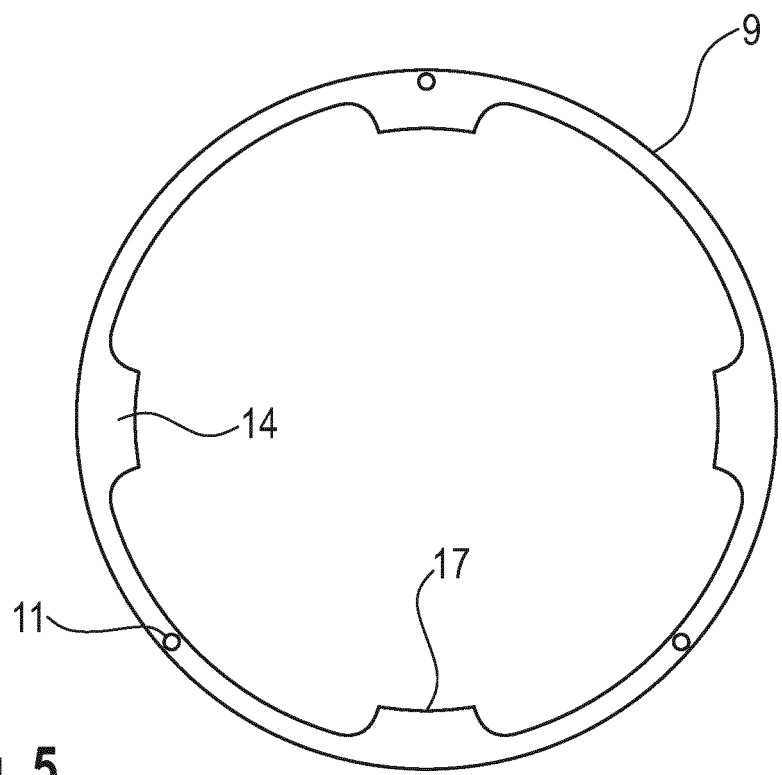
FIG. 5, FIG. 6, and FIG. 7 show in plan view in each case a ring that is a feature of an apparatus according to embodiments of the invention.

FIG. 5 shows in plan view a ring 9 having, in the embodiment shown, holes 11 and four inwardly facing projections 14, which are arranged in a manner distributed over the circumference at a distance of 90°. This embodiment is suitable for use in an apparatus in accordance with FIG. 4 in order therein to deposit according to the invention an epitaxial layer on the front side of a semiconductor wafer having a <100>-orientation. The ring 9 preferably consists of quartz glass, and the projections 14 of a material having a low transmittance in the IR range of the spectrum. The transmittance of the projections 14 in the range, relative to a material thickness of 10 mm, is preferably not more than 20%, particularly preferably not more than 5%. The projections 14 preferably consist of opaque quartz glass.

Figure 6:
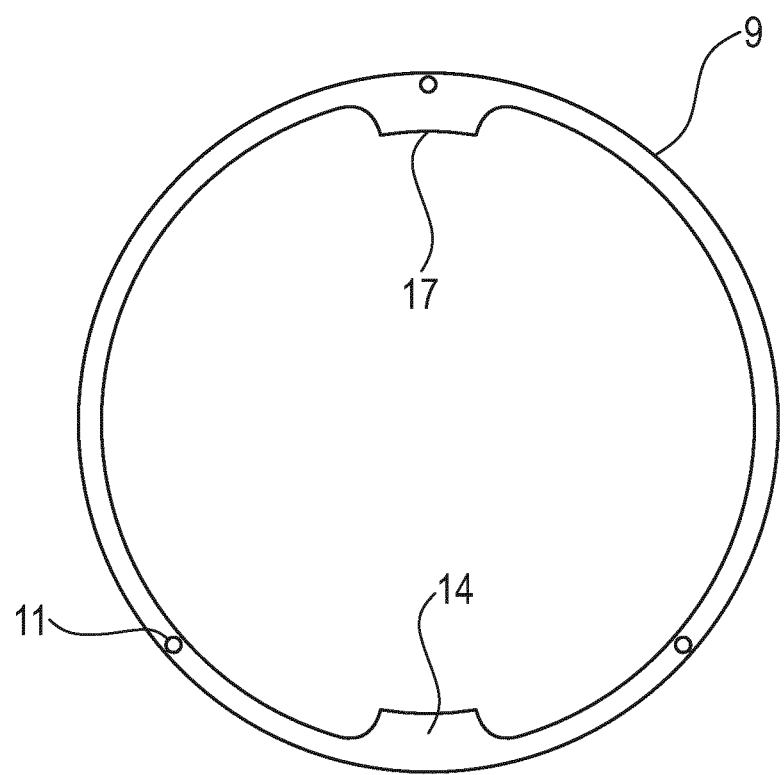

FIG. 6 shows in plan view a ring 9 having, in the embodiment shown, holes 11 and two inwardly facing projections 14, which are arranged in a manner distributed over the circumference at a distance of 180°. This embodiment is suitable for use in an apparatus in accordance with FIG. 4 in order therein to deposit according to the invention an epitaxial layer on the front side of a semiconductor wafer having a <110>-orientation. The ring 9 preferably consists of quartz glass, and the projections 14 of a material having a low transmittance in the IR range of the spectrum. The transmittance of the projections 14 in the range, relative to a material thickness of 10 mm, is preferably not more than 20%, particularly preferably not more than 5%. The projections 14 preferably consist of opaque quartz glass.

Figure 7:
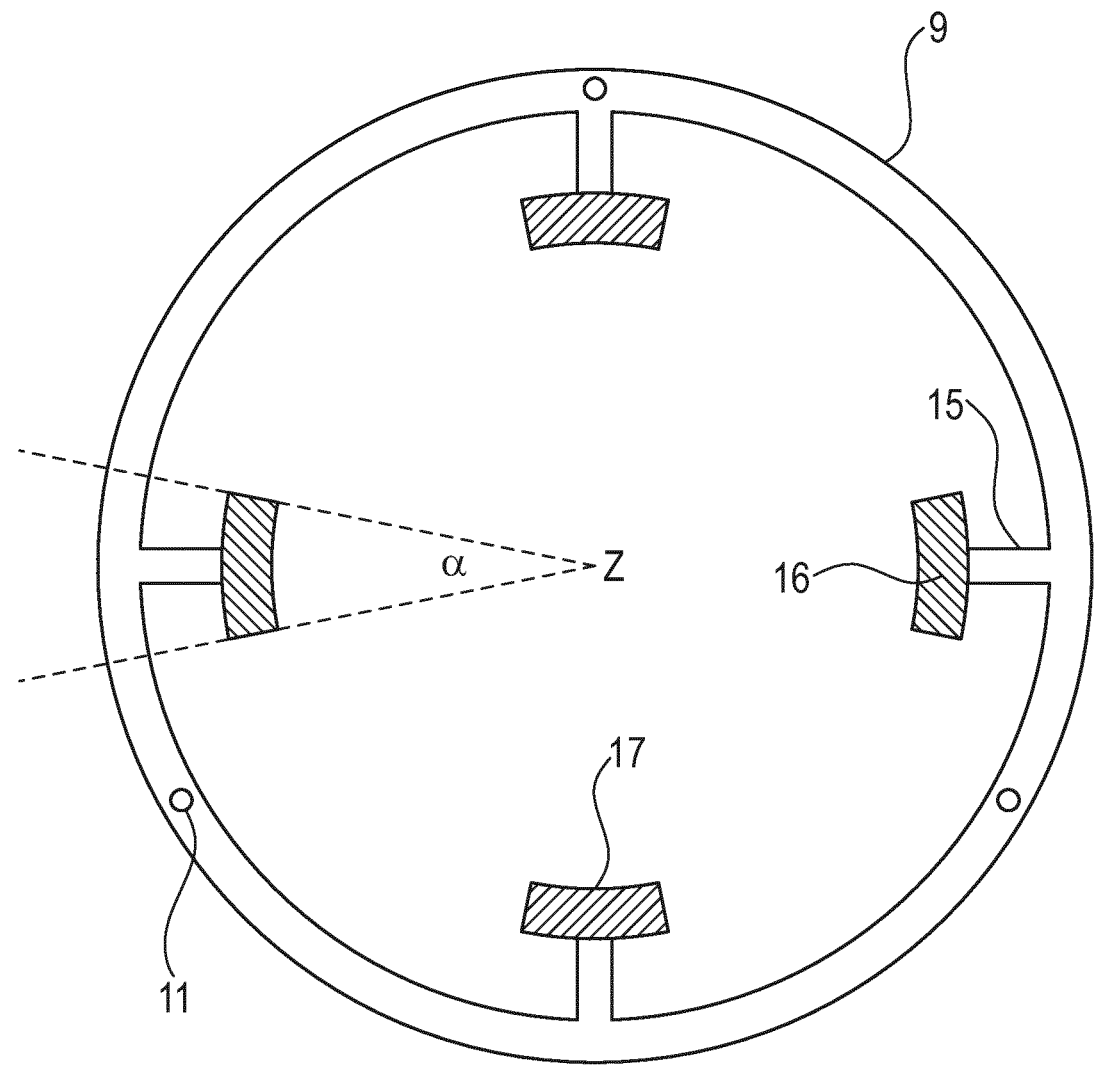

FIG. 7 shows in plan view a ring 9 having, in the embodiment shown, holes 11 and four inwardly facing projections 14, which are arranged in a manner distributed over the circumference at a distance of 90°. This embodiment is suitable for use in an apparatus in accordance with FIG. 4 in order therein to deposit according to the invention an epitaxial layer on the front side of a semiconductor wafer having a <100>-orientation. In the embodiment illustrated, the projections 14 are T-shaped and each include a web 15 having a radial length of preferably not less than 8 mm and not more than 18 mm and a ring segment 16. The ring segment 16 has a radial length and a width in a circumferential direction. The radial length of the ring segment 16 is preferably not less than 1.5 mm and not more than 8 mm, particularly preferably not less than 3 mm and not more than 8 mm. The width, expressed as an aperture angle α, is preferably not less than 15° and not more than 25°, particularly preferably 20°. The ring 9 and the webs 15 preferably consist of quartz glass, and the ring segments of a material having a low transmittance in the IR range of the spectrum.

The transmittance of the ring segments 16 in the range, relative to a material thickness of 10 mm, is preferably not more than 20%, particularly preferably not more than 5%. The ring segments 16 preferably consist of opaque quartz glass.

Figure 8:
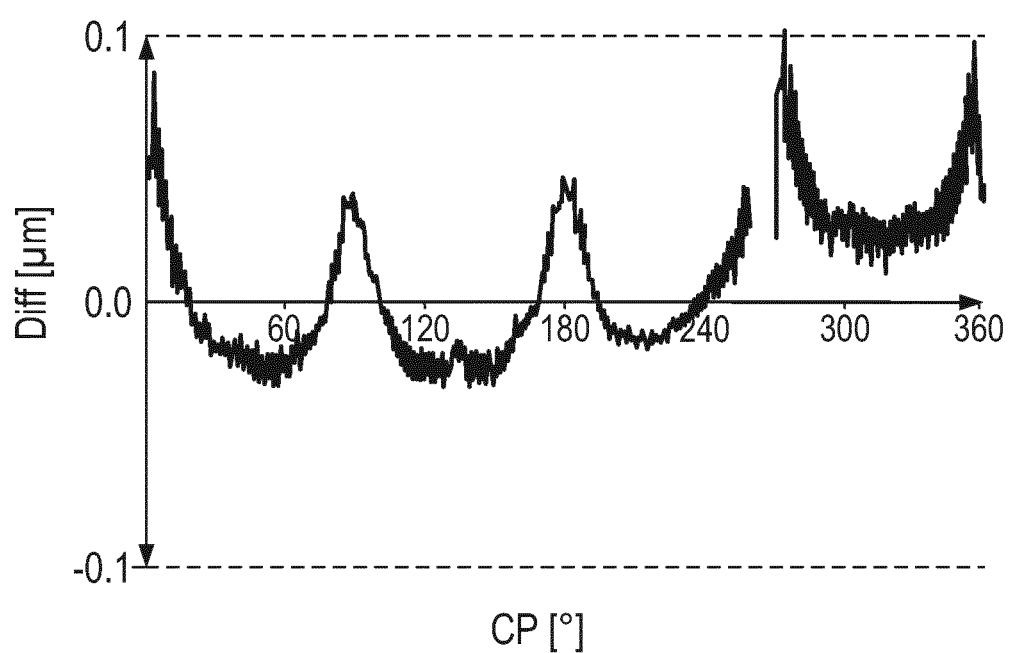
FIG. 8 and FIG. 9 each show the difference Diff between the thickness of an epitaxially coated semiconductor wafer at the distance of 1 mm from the edge of the semiconductor wafer and an average thickness of the coated semiconductor wafer as a function of a circumferential position CP, wherein the epitaxial layer was deposited either in a conventional manner (FIG. 8) or in a manner according to the invention (FIG. 9).
Figure 9:
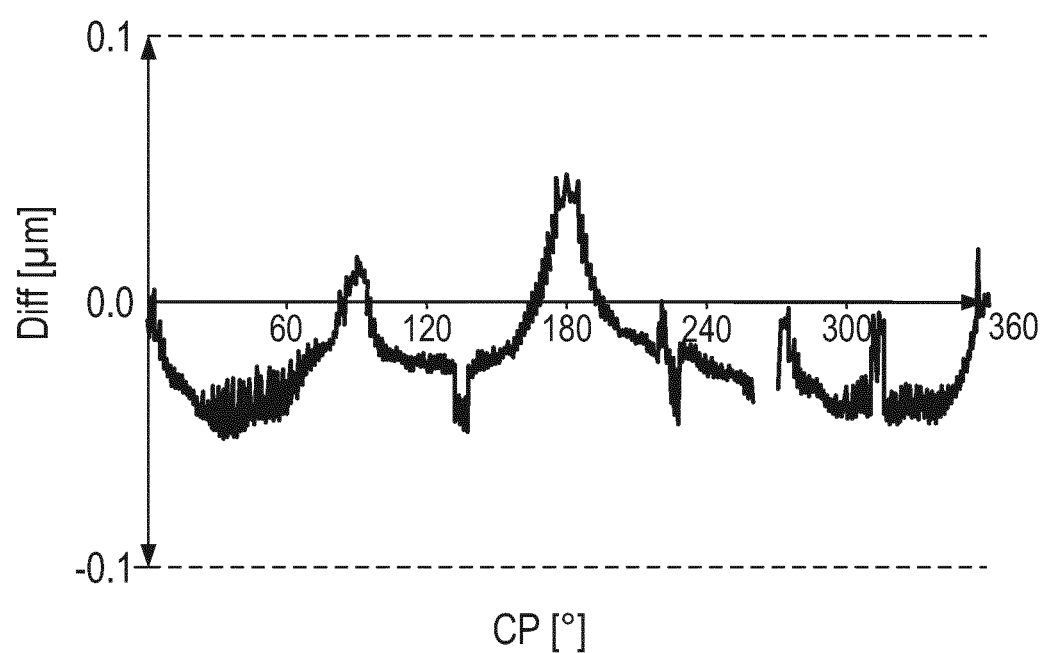

Semiconductor wafers composed of monocrystalline silicon having a diameter of 300 mm and a <100>-orientation of the front side were coated with an epitaxial layer composed of silicon in a single-wafer reactor. One portion of the semiconductor wafers (comparative example) was coated in a manner lying on a susceptor in accordance with FIG. 1 in an apparatus in accordance with FIG. 4, but without the ring 9 having been provided. Another portion of the semiconductor wafers (example) was coated in the same way, but in the presence of a ring 9 in an embodiment in accordance with FIG. 5, which ring was arranged in accordance with FIG. 4. The relative position of the semiconductor wafer and of the ring have been chosen in such a way that the intensity of thermal radiation was weakened upon passing through the projections of the ring, and thus the growth rate of the epitaxial layer was reduced in a targeted manner in the first partial regions of the semiconductor wafer. Afterward, the difference between the thickness of the coated semiconductor wafer at the distance of 1 mm from the edge and an average thickness of the corresponding semiconductor wafer was ascertained in each case. In the case of a semiconductor wafer produced according to the invention this difference is significantly smaller (FIG. 9) than in the case of a conventionally produced semiconductor wafer (FIG. 8).

The above description of exemplary embodiments should be understood to be by way of example. The disclosure given thereby firstly enables the person skilled in the art to understand the present invention and the advantages associated therewith, and secondly also encompasses obvious alterations and modifications of the described structures and methods within the understanding of the person skilled in the art. Therefore, all such alterations and modifications and also equivalents are intended to be covered by the scope of protection of the claims.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for depositing an epitaxial layer on a front side of a semiconductor wafer comprising monocrystalline material, the method comprising:
   providing the semiconductor wafer;
   arranging the semiconductor wafer on a susceptor;
   heating the semiconductor wafer to a deposition temperature using thermal radiation directed to the front side and to the rear side of the semiconductor wafer;
   conducting a deposition gas over the front side of the semiconductor wafer; and
   selectively reducing an intensity of a portion of the thermal radiation that is directed to the rear side of the semiconductor wafer such that first partial regions at an edge of the semiconductor wafer are heated with the reduced intensity as compared to adjacent second partial regions, wherein the first partial regions have a characteristic greater growth rate of the epitaxial layer as compared to the adjacent second partial regions under a uniform temperature of the semiconductor wafer as a result of an orientation of the monocrystalline material, and
   wherein a ring that is held by susceptor carrying arms is arranged below the susceptor, the ring having inwardly facing projections, the projections each comprising a web and a ring segment, wherein the ring segment consists of a material having a low transmittance in an infrared (IR) range of the spectrum and has a width in a circumferential direction which, expressed as an aperture angle α, is not less than 15° and not more than 25°.

2. An apparatus for depositing an epitaxial layer on a front side of a semiconductor wafer comprising monocrystalline material, the apparatus comprising:
   a susceptor;
   a device for holding and rotating the susceptor having a susceptor carrying shaft and susceptor carrying arms; and
   a ring that is held by the susceptor carrying arms and has inwardly facing projections that are configured to selectively reduce an intensity of thermal radiation passing through them such that first partial regions at an edge of the semiconductor wafer placed on the susceptor are heated with the reduced intensity as compared to adjacent second partial regions, wherein the first partial regions have a characteristic greater growth rate of the epitaxial layer as compared to the adjacent second partial regions under a uniform temperature of the semiconductor wafer as a result of an orientation of the monocrystalline material, and
   wherein the projections each comprise a web and a ring segment, and the ring segment consists of a material having a low transmittance in the infrared (IR) range of the spectrum and has a width in a circumferential direction which, expressed as an aperture angle α, is not less than 15° and not more than 25°.

3. The apparatus as claimed in claim 2, wherein the ring consists of quartz glass.

4. The apparatus as claimed in claim 2, comprising four projections having a distance to an adjacent projection of 90°.

5. The apparatus as claimed in claim 2, comprising two projections having a distance to an adjacent projection of 180°.

\* \* \* \* \*